(12) United States Patent
Yu et al.

(10) Patent No.: US 8,240,943 B2
(45) Date of Patent: *Aug. 14, 2012

(54) ON-PRESS DEVELOPABLE IMAGEABLE ELEMENTS

(75) Inventors: Jianfei Yu, Fort Collins, CO (US); Jianbing Huang, Trumbull, CT (US); Kevin B. Ray, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 942 days.

This patent is subject to a terminal disclaimer.

(21) Appl. No.: 12/169,735

(22) Filed: Jul. 9, 2008

(65) Prior Publication Data

US 2010/0009130 A1  Jan. 14, 2010

(51) Int. Cl.
*G03F 7/00* (2006.01)
*G03F 7/26* (2006.01)

(52) U.S. Cl. ............ 403/302; 430/271.1; 430/273.1; 430/281.1; 430/944; 101/453; 101/463.1

(58) Field of Classification Search ........... 430/270.1, 430/271.1, 273.1, 302; 428/195.1
See application file for complete search history.

(56) References Cited

U.S. PATENT DOCUMENTS

| | | | |
|---|---|---|---|
| 5,516,620 A | 5/1996 | Cheng et al. | |
| 5,599,650 A | 2/1997 | Bi et al. | |
| 5,677,110 A | 10/1997 | Chia et al. | |
| 6,846,614 B2 * | 1/2005 | Timpe et al. | 430/281.1 |
| 6,861,200 B2 * | 3/2005 | Oshima | 430/278.1 |
| 2002/0142250 A1 * | 10/2002 | Kita et al. | 430/302 |
| 2003/0068575 A1 | 4/2003 | Yanaka | |
| 2004/0170920 A1 * | 9/2004 | Goto | 430/271.1 |
| 2005/0170282 A1 | 8/2005 | Inno et al. | |
| 2005/0233251 A1 | 10/2005 | Kakino et al. | |
| 2006/0024612 A1 * | 2/2006 | Oshima et al. | 430/270.1 |
| 2006/0046189 A1 | 3/2006 | Kunita et al. | |
| 2006/0269874 A1 | 11/2006 | Huang et al. | |
| 2007/0072119 A1 | 3/2007 | Iwai et al. | |
| 2007/0275322 A1 | 11/2007 | Tao et al. | |
| 2008/0008957 A1 | 1/2008 | Munnelly et al. | |
| 2008/0057438 A1 | 3/2008 | Suzuki | |
| 2008/0311520 A1 * | 12/2008 | Yu et al. | 430/286.1 |
| 2009/0047599 A1 * | 2/2009 | Horne et al. | 430/281.1 |

FOREIGN PATENT DOCUMENTS

| | | |
|---|---|---|
| EP | 1 614 541 | 1/2006 |
| EP | 1 717 024 | 11/2006 |
| EP | 1 754 614 | 2/2007 |
| EP | 1 588 858 | 8/2007 |
| EP | 1 557 262 | 11/2007 |
| EP | 1 857 877 A1 | 11/2007 |
| EP | 1 736 312 | 4/2008 |
| JP | 2002019318 A * | 1/2002 |
| JP | 2002086948 A * | 3/2002 |
| JP | 2002205466 A * | 7/2002 |
| WO | 2006/127313 | 11/2006 |

OTHER PUBLICATIONS

U.S. Appl. No. 11/762,288, filed Jun. 13, 2007 titled "On-Press Developable Negative-Working Imageable Elements and Methods of Use" by Jianfei Yu et al.

U.S. Appl. No. 11/838,935, filed Aug. 15, 2007 titled "Negative-Working Imageable Elements and Methods of Use" by Geoffrey Horne et al.

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

A negative-working imageable element has an imageable layer and a topcoat layer that contains a composition that will change color upon exposure to imaging infrared radiation. The imageable element can be imaged and developed on-press to provide images with improved contrast for print-out.

16 Claims, No Drawings

ON-PRESS DEVELOPABLE IMAGEABLE ELEMENTS

FIELD OF THE INVENTION

This invention relates to imageable elements such as negative-working lithographic printing plate precursors that can be developed on-press to provide images with improved contrast ("printout") for visual inspection. The invention also relates to methods of using these imageable elements.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two common ways of using radiation-sensitive compositions for the preparation of printing plates. For negative-working printing plates, exposed regions in the radiation-sensitive compositions are hardened and unexposed regions are washed off during processing with a developer or other processing solution. For positive-working printing plates, the exposed regions are dissolved in a processing solution and the unexposed regions become an image.

Various negative-working radiation compositions and imageable elements are described in U.S. Pat. No. 6,309,792 (Hauck et al.), U.S. Pat. No. 6,569,603 (Furukawa), U.S. Pat. No. 6,893,797 (Munnelly et al.), and U.S. Pat. No. 6,787,281 (Tao et al.), and in U.S. Patent Application Publications 2003/0118939 (West et al.), 2005/0008971 (Mitsumoto et al.), and 2005/0204943 (Makino et al.), and in EP Publications 1,079,276A (Lifka et al.), EP 1,182,033A (Fujimaki et al.), and EP 1,449,650A (Goto).

Various negative-working imageable elements have been designed for processing or development "on-press" using a fountain solution, lithographic printing ink, or both. For example, such elements are described in U.S. Patent Application Publication 2005-263021 (Mitsumoto et al.) and in U.S. Pat. No. 6,071,675 (Teng), U.S. Pat. No. 6,387,595 (Teng), U.S. Pat. No. 6,482,571 (Teng), U.S. Pat. No. 6,495,310 (Teng), U.S. Pat. No. 6,541,183 (Teng), U.S. Pat. No. 6,548,222 (Teng), U.S. Pat. No. 6,576,401 (Teng), U.S. Pat. No. 6,899,994 (Huang et al.), U.S. Pat. No. 6,902,866 (Teng), and U.S. Pat. No. 7,089,856 (Teng).

U.S. Patent Application Publications 2005/0170282 (Inno et al.), 2005/0233251 (Kakino et al.), 2003/0068575 (Yanaka), 2006/0046189 (Kunita et al.), and 2007/0072119 (Iwai et al.), and EP Publications 1,557,262 (Inno et al.), 1,588,858 (Kakino et al.), 1,614,541 (Callant et al.), 1,736,312 (Callant et al.), and 1,754,614 (Kakino et al.), 1,717,024 (Inno et al.) describe lithographic printing plate precursors that contain a discoloring agent or system capable of generating a color change upon exposure for providing print-out.

Publication SPCOM000170014D that can be read at IP.com describes a negative-working, on-press developable lithographic printing plate exhibiting good printout, good run length, and consistency in developability no matter the type of aluminum-containing substrate that is used.

Copending and commonly assigned U.S. Ser. No. 11/838,935 (filed Aug. 15, 2007 by Home, K. Ray, Knight, Huang, Tao, and Munnelly) describes the use of specific spirolactone or spirolactam leuco dye color formers in the imageable layer of negative-working imageable elements.

In addition, copending and commonly assigned U.S. Ser. No. 11/762,288 (filed Jun. 13, 2007 by Yu and K. Ray) describes on-press developable negative-working imageable elements that include a phosphate (meth)acrylate and do not require a post-exposure baking step.

Problem to be Solved

After imaging, printing plates may be inspected to make sure the desired image has been obtained. For printing plates normally processed (or developed) off-press, this inspection can occur easily before mounting on the printing press. The plate manufacturer often adds a colorant to the imaging composition to facilitate this inspection.

For imaged elements that are to be developed on-press, the image is not easily identified. Adding colorant to on-press developable imaging compositions compromises plate shelf life, on-press developability, or imaging sensitivity, and the colorant may color-contaminate printing press inks. The problem of development variability is particularly acute when the imageable layer is disposed on a sulfuric acid-anodized aluminum substrate.

Unfortunately, imageable elements that have good run length and improved developability may exhibit poorer printout (color contrast between imaging and non-imaged regions after exposure and before development) in the resulting image.

Thus, there is a need for adequate print-out that provides visibility to the image on the printing plate before on-press development. Further, there is a need to provide improved printout without any degradation in run length, developability, or other desired properties.

SUMMARY OF THE INVENTION

This invention provides a negative-working, on-press developable imageable element comprising a substrate having thereon an imageable layer comprising:

a radically polymerizable component, an initiator composition capable of generating free radicals sufficient to initiate polymerization of free radically polymerizable groups upon exposure to imaging infrared radiation, a primary polymeric binder that is optionally present in the form of discrete particles, and an infrared radiation absorbing dye, the element further comprising a topcoat layer disposed on the imageable layer, the topcoat layer comprising a water-soluble polymer binder and a composition that is capable of changing color upon exposure to imaging infrared radiation.

In some embodiments of this invention, the imageable element comprises a topcoat layer that includes a cyanine dye chromophore that is represented by the following Structure (CHROMOPHORE):

(CHROMOPHORE)

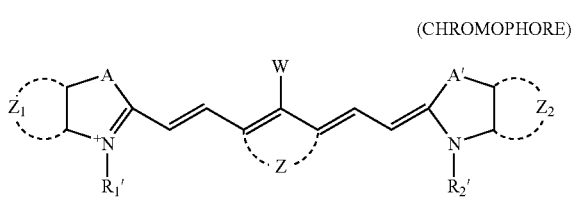

wherein W is —N(Q$_1$)(Q$_2$) or Cl, wherein Q$_1$ and Q$_2$ are independently substituted or unsubstituted aryl groups, A and A' are independently —S—, —O—, —NH—, —CH$_2$—, or —CR'R"— groups wherein R' and R" are independently substituted or unsubstituted alkyl groups, or R' and R" together can form a substituted or unsubstituted cyclic group, Z represents the carbon atoms needed to form a 5-to 7-membered carbocyclic ring, Z$_1$ and Z$_2$ are independently substituted or unsubstituted benzo or naphtho condensed rings, and R$_1$' and R$_2$' are independently substituted or unsubstituted alkyl, cycloalkyl, or aryl groups, provided that the cyanine dye chromophore further comprises one or more water-solubilizing groups.

This invention also provides a method comprising:

A) imagewise exposing the imageable element of this invention using infrared imaging radiation to produce exposed and non-exposed regions, and B) with or without a post-exposure baking step, developing the imagewise exposed element to remove predominantly only the non-exposed regions in the presence of a fountain solution, lithographic printing ink, or a combination thereof.

For example, the present invention can be used to provide an on-press developed, negative-working lithographic printing plate having a hydrophilic substrate surface, such as an aluminum substrate surface that has been anodized with sulfuric acid.

The infrared radiation-sensitive imageable elements of this invention exhibit several desirable properties such as consistency in on-press developability, high sensitivity, good shelf life, and long run length without the need for a post-exposure baking step. In addition, the imaged elements have improved print-out after imaging (and before development) at lower imaging energies without an unacceptable increase in dot gain. These advantages are achieved by providing a topcoat that contains an acid-generating composition that provides a color change upon exposure to imaging IR radiation.

DETAILED DESCRIPTION OF THE INVENTION

Definitions

Unless the context indicates otherwise, when used herein, the terms "imageable element", "lithographic printing plate precursor", and "printing plate precursor" are meant to be references to embodiments of the present invention.

In addition, unless the context indicates otherwise, the various components described herein such as "primary polymeric binder", "free radically polymerizable component", "infrared radiation absorbing compound", "acid-generating compound", "iodonium cation", "boron-containing anion", "secondary polymeric binder", "phosphate (meth)acrylate", and similar terms also refer to mixtures of such components. Thus, the use of the articles "a", "an", and "the" is not necessarily meant to refer to only a single component.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), Pure Appl. Chem. 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Imageable Layers

The imageable elements include an infrared (IR) radiation-sensitive composition disposed on a suitable substrate to form an imageable layer. The imageable elements may have any utility wherever there is a need for an applied coating that is polymerizable using suitable radiation, and particularly where it is desired to remove non-exposed regions of the coating instead of exposed regions. The IR radiation-sensitive compositions can be used to prepare an imageable layer in imageable elements such as printed circuit boards for integrated circuits, microoptical devices, color filters, photomasks, and printed forms such as lithographic printing plate precursors that are defined in more detail below.

The imageable layer (and IR radiation-sensitive composition) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated components that can be polymerized or crosslinked include ethylenically unsaturated polymerizable monomers that have one or more of the polymerizable groups, including unsaturated esters of alcohols, such as acrylate and methacrylate esters of polyols. Oligomers or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), Sartomer 399 (dipentaerythritol pentaacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, N.Y., 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262. For example, useful free radically polymerizable components are also described in EP 1,182,033A1 (noted above), beginning with paragraph [0170], and in U.S Pat. No. 6,309,792 (Hauck et al.), U.S. Pat. No. 6,569,603 (Furukawa), and U.S. Pat. No. 6,893,797 (Munnelly et al.), all of which are incorporated herein by reference for such components.

Other useful free radically polymerizable components include those described in copending and commonly assigned U.S. Ser. No. 11/949,810 (filed Dec. 4, 2007 by Bauman, Dwars, Strehmel, Simpson, Savariar-Hauck, and Hauck) that include 1H-tetrazole groups. This copending application is incorporated herein by reference with reference to these components.

In addition to, or in place of the free radically polymerizable components described above, the imageable layer (and IR radiation-sensitive composition) may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule, or typically from 2 to 10 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

Useful commercial products that comprise polymers that can be used in this manner include Bayhydrol® UV VP LS 2280, Bayhydrol® UV VP LS 2282, Bayhydrol® UV VP LS 2317, Bayhydrol® UV VP LS 2348, and Bayhydrol® UV XP 2420, that are all available from Bayer MaterialScience, as well as Laromer™ LR 8949, Laromer™ LR 8983, and Laromer™ LR 9005, that are all available from BASF.

The one or more free radically polymerizable components (monomeric, oligomeric, or polymeric) can be present in the imageable layer in an amount of at least 10 weight % and up to 80 weight %, and typically from about 20 to about 50 weight %, based on the total dry weight of the imageable layer. The weight ratio of the free radically polymerizable component to the total polymeric binders (described below) is generally from about 5:95 to about 95:5, and typically from about 10:90 to about 90:10, or even from about 30:70 to about 70:30.

The imageable layer (and IR radiation-sensitive composition) also includes an initiator composition that includes one or more initiators that are capable of generating free radicals sufficient to initiate polymerization of all the various free radically polymerizable components upon exposure of the composition to imaging radiation. The initiator composition is generally responsive to infrared imaging radiation corresponding to the spectral range of at least 700 nm and up to and including 1400 nm (typically from about 750 to about 1250 nm). Initiator compositions are used that are appropriate for the desired imaging wavelength(s).

The initiator composition can include one or more iodonium cations and one or more boron-containing anions at a molar ratio of at least 1.2:1 and up to 3.0:1, and typically from about 1.4:1 to about 2.5:1 or from about 1.4:1 to about 2.0:1.

Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl) [4-(2-methylpropyl)phenyl]iodonium hexafluorophosphate and is supplied in a 75% propylene carbonate solution.

The iodonium cations can be paired with a suitable number of negatively-charged counterions such as halides, hexafluorophosphate, thiosulfate, hexafluoroantimonate, tetrafluoroborate, sulfonates, hydroxide, perchlorate, others readily apparent to one skilled in the art.

Thus, the iodonium cations can be supplied as part of one or more iodonium salts, and as described below, the iodonium cations can be supplied as iodonium borates also containing suitable boron-containing anions. For example, the iodonium cations and the boron-containing anions can be supplied as part of salts that are combinations of Structures (IB) and (IBz) described below, or both the iodonium cations and boron-containing anions can be supplied from different sources. However, if they are supplied at least from the iodonium borate salts, since such salts generally supply about a 1:1 molar ratio of iodonium cations to boron-containing anions, additional iodonium cations must be supplied from other sources, for example, from iodonium salts described above.

For example, the imageable layer (and element) can comprise a mixture of iodonium cations, some of which are derived from an iodonium borate (described below) and others of which are derived from a non-boron-containing iodonium salt (described above). When both types of iodonium salts are present, the molar ratio of iodonium derived from the iodonium borate to the iodonium derived from the non-boron-containing iodonium salt can be up to 5:1 and typically up to 2.5:1.

One class of useful iodonium cations include diaryliodonium cations that are represented by the following Structure (IB):

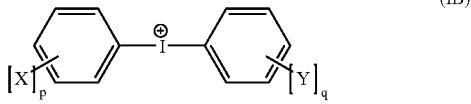

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono-and poly-, branched and linear haloalkyls), substituted or unsubstituted alkyloxy having 1 to 20 carbon atoms (for example, substituted or unsubstituted methoxy, ethoxy, isopropoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono-and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2-or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

Useful boron-containing anions are organic anions having four organic groups attached to the boron atom. Such organic anions can be aliphatic, aromatic, heterocyclic, or a combination of any of these. Generally, the organic groups are substituted or unsubstituted aliphatic or carbocyclic aromatic groups. For example, useful boron-containing anions can be represented by the following Structure (IBz):

wherein $R_1$, $R_2$, $R_3$, and $R_4$ are independently substituted or unsubstituted alkyl groups having 1 to 12 carbon atoms (such as methyl, ethyl, n-propyl, isopropyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. Z-can be a tetraphenyl borate wherein the phenyl groups are substituted or unsubstituted (for example, all are unsubstituted phenyl groups).

Some representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-4'-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis (penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Mixtures of two or more of these compounds can also be used in the iodonium borate initiator composition.

Such diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J.Polymer Sci., Part A: Polymer Chemistry,* 37, 4241-4254 (1999), both of which are incorporated herein by reference.

The boron-containing anions can also be supplied as part of infrared radiation absorbing dyes (for example, cationic dyes) as described below. Such boron-containing anions generally are defined as described above with Structure (IBz).

The iodonium cations and boron-containing anions are generally present in the imageable layer (and IR radiation sensitive composition) in a combined amount of at least 1% and up to and including 15%, and typically at least 4 and up to and including about 10%, based on total dry weight of the imageable layer. The optimum amount of the various initiator components may differ for various compounds and the sensitivity of the imageable layer (radiation-sensitive composition) that is desired and would be readily apparent to one skilled in the art.

The imageable layer (and IR radiation sensitive composition) may also include heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1, 5-diphenyl-1,2,4-triazole, and 5-(p-aminophenyl)-3-mercapto-1,2,4-triazole.

Some useful initiator compositions include the following combinations:

iodonium cations supplied from non-boron containing iodonium salts only and boron-containing anions separately supplied from other salts including cationic infrared dyes, iodonium cations supplied from both non-boron containing iodonium salts and iodonium borates and boron-containing anions from only the iodonium borates, or iodonium cations supplied from both non-boron containing iodonium salts and iodonium borates and boron-containing anions from both iodonium borates and other sources (such as cationic IR dyes).

The imageable layer (IR radiation-sensitive composition) generally includes one or more infrared radiation absorbing compounds that absorb imaging radiation, or sensitize the composition to imaging radiation having a $\lambda_{max}$ in the IR region of the electromagnetic spectrum noted above (for example from about 700 to about 1400 nm). Other embodiments include infrared radiation absorbing compounds ("IR absorbing compounds") that generally absorb radiation from about 700 to about 1200 nm and typically from about 750 to about 1250 nm with minimal absorption at 300 to 600 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany), from which IR dye S0930 used in the Examples was obtained. Other useful dyes for near infrared diode laser beams are described, for example, in U.S Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The infrared radiation absorbing dye can be present in the imageable layer (and IR radiation-sensitive composition) in an amount generally of at least 0.5% and up to and including 10% and typically at least 1 and up to and including 10%, based on total dry weight of the imageable layer. The particular amount needed for this purpose would be readily apparent to one skilled in the art, depending upon the specific compound used.

The imageable layer (and IR radiation sensitive composition) includes one or more primary polymeric binders that are usually (but not always) present in the form of discrete particles having an average particle size of from about 10 to about 500 nm, and typically from about 150 to about 450 nm, and generally distributed uniformly within that layer. The particulate polymeric binders exist at room temperature as discrete particles, for example in an aqueous dispersion. However, the particles can also be partially coalesced or deformed, for example at temperatures used for drying coated imageable layer formulations. Even in this environment, the particulate structure is not destroyed. Such polymeric binders generally have a molecular weight (Me) of at least 30,000 and typically at least 50,000 to about 100,000, or from about 60,000 to about 80,000, as determined by refractive index.

Some useful primary polymeric binders include polymeric emulsions or dispersions of polymers having pendant poly(alkylene oxide) side chains that can render the imageable elements as "on-press" developable. Such primary polymeric binders are described for example in U.S. Pat. No. 6,582,882 (Pappas et al.) and U.S. Pat. No. 6,899,994 (noted above) and U.S. Patent Application Publication 2005/0123853 (Munnelly et al.). These primary polymeric binders are present in the imageable layer as discrete particles.

Other useful primary polymeric binders have hydrophobic backbones and comprise both of the following a) and b) recurring units, or the b) recurring units alone:

a) recurring units having pendant cyano groups attached directly to the hydrophobic backbone, and b) recurring units having hydrophilic pendant groups comprising poly(alkylene oxide) segments.

These primary polymeric binders comprise poly(alkylene oxide) segments such as poly(ethylene oxide) or poly(propylene oxide) segments. These polymers can be graft copolymers having a main chain polymer and poly(alkylene oxide) pendant side chains or segments or block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof By way of example only, such recurring units can comprise pendant groups comprising cyano, cyano-substituted alkylene groups, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.).

Also by way of example, such primary polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ether methacrylate, or a combination thereof, and C) optionally, monomers such as acrylic acid, methacrylic acid, styrene, hydroxystyrene, acrylate esters, methacrylate esters (such as methyl methacrylate and benzyl methacrylate), acrylamide, methacrylamide, or a combination of such monomers.

The amount of the poly(alkylene oxide) segments in such primary polymeric binders is from about 0.5 to about 60 weight % and typically from about 2 to about 50 weight %. The amount of (alkylene oxide) segments in the block copolymers is generally from about 5 to about 60 weight % and typically from about 10 to about 50 weight %. It is also likely that the primary polymeric binders having poly(alkylene oxide) side chains are present in the form of discrete particles.

In some embodiments, the primary polymeric binders are radically polymerizable primary polymeric binders. These primary polymeric binders can be "self-crosslinkable", by which we mean that a separate free radically polymerizable component is not necessary. Such binders have a backbone comprising multiple (at least two) urethane moieties. In some embodiments, there are at least two of these urethane moieties in each backbone recurring unit. The primary polymeric binders also include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule.

The free radically polymerizable groups (or ethylenically unsaturated groups) can be part of aliphatic or aromatic acrylate side chains attached to the polymeric backbone. Generally, there are at least 2 and up to 20 such groups per molecule, or typically from 2 to 10 such groups per molecule.

This primary polymeric binders can also comprise hydrophilic groups including but not limited to, carboxy, sulfo, or phospho groups, either attached directly to the backbone or attached as part of side chains other than the free radically polymerizable side chains. In most embodiments, the hydrophilic groups, such as carboxy groups, are directly attached to the backbone.

Useful commercial products that comprise primary polymeric binders useful in this invention include but are not limited to, Bayhydrol® UV VP LS 2280, Bayhydrol® UV VP LS 2282, Bayhydrol® UV VP LS 2317, Bayhydrol® UV VP LS 2348, and Bayhydrol® UV XP 2420, that are all available from Bayer MaterialScience, as well as Laromer™ LR 8949, Laromer™ LR 8983, and Laromer™ LR 9005, that are all available from BASF.

Other useful primary polymeric binders that are particulate in form include poly(urethane-acrylic) hybrids. This hybrid has a molecular weight of from about 50,000 to about 500,000. These hybrids can be either "aromatic" or "aliphatic" in nature depending upon the specific reactants used in their manufacture. Blends of particles of two or more poly(urethane-acrylic) hybrids can also be used. For example, a blend of Hybridur® 570 polymer dispersion with Hybridur® 870 polymer dispersion could be used.

Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly (urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents. Further details about each commercial Hybridur® polymer dispersion can be obtained by visiting the Air Products and Chemicals, Inc. website.

The primary polymeric binder is generally present in the radiation-sensitive composition in an amount of at least 10% and up to 90%, and typically from about 10 to about 70%, based on the total imageable layer dry weight. These binders may comprise up to 100% of the dry weight of all polymeric binders (primary polymeric binders plus any secondary polymeric binders).

Additional polymeric binders ("secondary" polymeric binders) may also be used in the imageable layer in addition to the primary polymeric binders. Such polymeric binders can be any of those known in the art for use in negative-working radiation-sensitive compositions other than those mentioned above. The secondary polymeric binder(s) may be present in an amount of from about 1.5 to about 70 weight % and typically from about 1.5 to about 40%, based on the dry coated weight of the imageable layer, and it may comprise from about 30 to about 60 weight % of the dry weight of all polymeric binders.

The secondary polymeric binders can also be particulate polymers that have a backbone comprising multiple (at least two) urethane moieties. Such polymeric binders generally have a molecular weight (Me) of at least 2,000 and typically at least 100,000 to about 500,000, or from about 100,000 to about 300,000, as determined by dynamic light scattering. These polymeric binders generally are present in the imageable layer in particulate form, meaning that they exist at room temperature as discrete particles, for example in an aqueous dispersion. However, the particles can also be partially coalesced or deformed, for example at temperatures used for drying coated imageable layer formulations. Even in this environment, the particulate structure is not destroyed. In most embodiments, the average particle size of these polymeric binders is from about 10 to about 300 nm and typically the average particle size is from about 30 to about 150 nm. The particulate secondary polymeric binder is generally obtained commercially and used as an aqueous dispersion having at least 20% and up to 50% solids. It is possible that these polymeric binders are at least partially crosslinked among urethane moieties in the same or different molecules, which crosslinking could have occurred during polymer manufacture. This still leaves the free radically polymerizable groups available for reaction during imaging.

The secondary polymeric binders may be homogenous, that is, dissolved in the coating solvent, or may exist as discrete particles. Such secondary polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182, 033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.), both incorporated herein by reference. Copolymers of polyethylene glycol methacrylate/ acrylonitrile/styrene in particulate form, dissolved copolymers derived from carboxyphenyl methacrylamide/acrylonitrile/methacrylamide/N-phenyl maleimide, copolymers derived from polyethylene glycol methacrylate/acrylonitrile/ vinyl carbazole/styrene/methacrylic acid, copolymers derived from N-phenyl maleimide/methacrylamide/methacrylic acid, copolymers derived from urethane-acrylic intermediate A (the reaction product ofp-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenylmaleimide are useful.

The imageable layer (IR radiation-sensitive composition) can further comprise one or more phosphate (meth)acrylates, each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety. Such compounds and their use in imageable layers are described in more detail in U.S. Pat. No. 7,175,969 (Ray et al.) that is incorporated herein by reference.

Representative phosphate (meth)acrylates include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan), a phosphate of a di(caprolactone modified 2-hydroxyethyl methacrylate) that is available as Kayamer PM-21 (Nippon Kayaku, Japan), and a polyethylene glycol methacrylate phosphate with 4-5 ethoxy groups that is available as Phosmer M, Phosmer M H, Phosmer P E, Phosmer P E H, Phosmer P P. and Phosmer PPH from Uni-Chemical Co., Ltd. (Japan).

The phosphate (meth)acrylate can be present in the radiation-sensitive composition in an amount of at least 0.5 and up to and including 20% and typically at least 0.9 and up to and including 10%, based on total dry composition weight.

The imageable layer can also include a "primary additive" that is a poly(alkylene glycol) or an ether or ester thereof that has a molecular weight of at least 200 and up to and including 4000. This primary additive can be present in an amount of at least 2 and up to and including 50 weight %, based on the total dry weight of the imageable layer. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are Sartomer SR9036 (ethoxylated (30) bisphenol A dimethacrylate), CD9038 (ethoxylated (30) bisphenol A diacrylate), SR399 (dipentaerythritol pentaacrylate), and Sartomer SR494 (ethoxylated (5) pentaerythritol tetraacrylate), and similar compounds all of which that can be obtained from Sartomer Company, Inc. In some embodiments, the primary additive may be "nonreactive" meaning that it does not contain polymerizable vinyl groups.

The imageable layer can also include a "secondary additive" that is a poly(vinyl alcohol), a poly(vinyl pyrrolidone), poly(vinyl imidazole), or polyester in an amount of up to and including 20 weight % based on the total dry weight of the imageable layer.

The imageable layer can also include a variety of optional compounds including but not limited to, colorants and colorant precursors, color developers, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Topcoat Layer Formulations

The imageable element includes what is conventionally known as an overcoat or topcoat layer (such as an oxygen impermeable topcoat) applied to and disposed over the imageable layer for example, as described in WO 99/06890 (Pappas et al.). Such topcoat layers comprise one or more water-soluble polymer binders chosen from such polymers as poly(vinyl alcohol)s, poly(vinyl pyrrolidone), poly(ethyleneimine), poly(vinyl imidazole), and copolymers of two or more of vinyl pyrrolidone, ethyleneimine, and vinyl imidazole, and generally have a dry coating weight of at least 0.1 and up to and including 2 g/m² (typically from about 0.1 to about 0.5 g/m²) in which the water-soluble polymer(s) comprise at least 50% and up to 98% of the dry weight of the topcoat layer. Topcoat layer polymer binders are also described in U.S. Pat. No. 3,458,311 (Alles), U.S. Pat. No. 4,072,527 (Fanni), and U.S. Pat. No. 4,072,528 (Bratt), and LP Publications 275,147A2 (Wade et al.), 403,096A2 (Ali), 354,475A2 (Zertani et al.), 465,034A2 (Ueda et al.), and 352,630A2 (Zertani et al.).

The topcoat layer also includes a composition that is capable of changing color upon exposure to imaging infrared radiation. This composition can comprise various component formulations. In one embodiment, it comprises: (1) an infrared absorbing compound, (2) a compound that, in the presence of this IR absorbing compound generates an acid in response to the imaging infrared radiation, and optionally (3) one or more compounds that provide a color change in the presence of an acid. Each of these components is defined below. In some embodiments, components (1) and (3) are the same, while in other embodiments, they are different. In the latter embodiments, component (3) can be a spirolactone or spirolactam colorant precursor. Such compounds are generally colorless or weakly colored until the presence of an acid causes the ring to open providing a colored species, or more intensely colored species.

For example, useful spirolactone and spirolactam colorant precursors include compounds represented by the following Structure (CF):

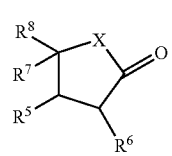

(CF)

wherein X is —O— or —NH—, $R^5$ and $R^6$ together form a carbocyclic or heterocyclic fused ring. The carbocyclic fused ring can be saturated or unsaturated and is typically 5 to 10 carbon atoms in size. Typically, 6-membered benzene fused rings are present. These rings can be substituted or unsubstituted.

$R^7$ and $R^8$ are independently substituted or unsubstituted carbocyclic groups that are either saturated (aryl groups) or unsaturated (cycloalkyl groups). Typically, they are substituted or unsubstituted aryl groups having 6 or 10 carbon atoms in the ring. $R^7$ and $R^8$ can also be independently 5-to 10-membered, substituted or unsubstituted heterocyclic groups (such as pyrrole and indole rings). Alternatively, $R^7$ and $R^8$ together can form a substituted or unsubstituted carbocyclic or heterocyclic ring as previously defined.

More useful colorant precursors can be represented by the following Structure (CF-1):

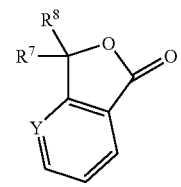

wherein Y is a nitrogen atom or methine group and $R^7$ and $R^8$ are as described above. Compounds wherein Y is a methine group are particularly useful.

Examples of useful colorant precursors include but are not limited to, Crystal Violet Lactone, Malachite Green Lactone, 3-(N,N-diethylamino)-6-chloro-7-(β-ethoxyethylamino) fluoran, 3-(N,N,N-triethylamino)-6-methyl-7-anilinofluoran, 3-(N,N-diethylamino)-7-chloro-7-o-chlorofluoran, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-chlorofluoran, 3-(N,N-diethylamino)-7-(4-chloroanilino)fluoran, 3-(N,N-diethylamio)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis((1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, and 3-(4-diethylaminophenyl)-3-(1-ethyl-2-methylindol-3-yl) phthalide.

Some specific useful colorant precursors are represented by the following structures:

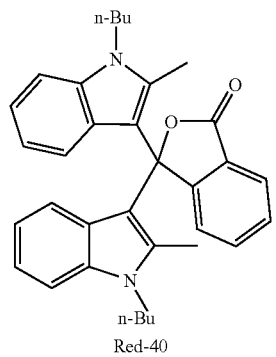

Red-40

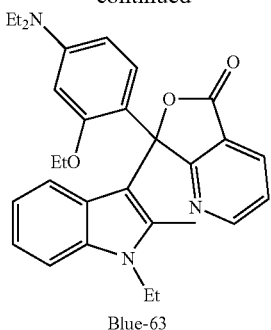

Blue-63

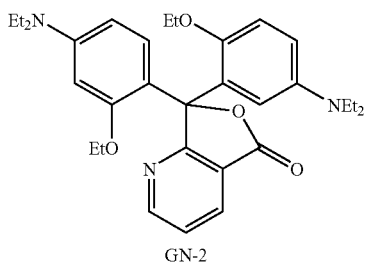

GN-2

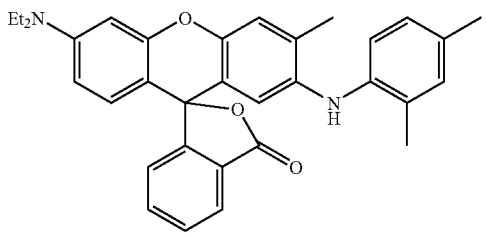

Black-15

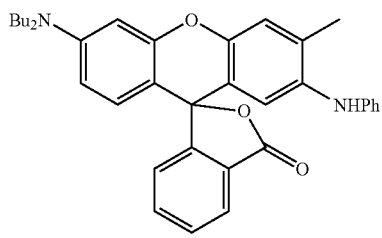

ODB-2

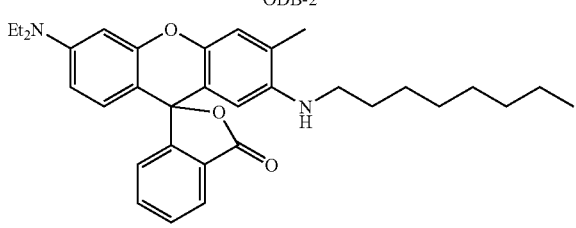

ODB-4

The colorant precursors can be present in the topcoat layer in an amount of at least 1 and up to 10%, and typically from about 3 to about 6%, based on the dry topcoat layer weight.

In many embodiments, component (1) is an infrared radiation absorbing cyanine dye ("IR dye") that comprises a cyanine dye chromophore that is represented by the following Structure (CHROMOPHORE):

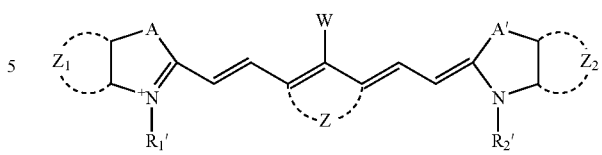

(CHROMOPHORE)

wherein W is —N($Q_1$)($Q_2$) or Cl. The $Q_1$ and $Q_2$ groups are independently substituted or unsubstituted aromatic carbocyclic groups, for example substituted or unsubstituted phenyl or naphthyl groups.

A and A' are independently —S—, —O—, —NH—, —$CH_2$—, or —CR'R"— groups wherein R' and R" are independently substituted or unsubstituted alkyl groups having 1 to 8 carbon atoms (such as methyl, ethyl, isopropyl, t-butyl, n-hexyl, benzyl, and n-octyl groups). In addition, R' and R" together can form a substituted or unsubstituted cyclic group (either a substituted or unsubstituted carbocyclic or heterocyclic group having 5 or 6 atoms in the ring). For example, R' and R" can be independently substituted or unsubstituted alkyl groups having 1 to 4 carbon atoms. In some embodiments, A and A' are both —C($CH_3$)$_2$—.

Z represents the additional carbon atoms needed to provide a substituted or unsubstituted 5-to 7-membered carbocyclic ring, and typically to provide a 5-membered carbocyclic ring.

$Z_1$ and $Z_2$ are independently substituted or unsubstituted benzo or naphtho condensed rings. These rings can have one or more substituents such as substituted or unsubstituted alkyl, aryl, and alkoxy groups, or nitro, cyano, trifluoromethyl, acyl, halo, sulfono, carboxy, or sulfonate groups. In most embodiments, $Z_1$ and $Z_2$ are both unsubstituted benzo condensed rings.

$R_1$' and $R_2$' are independently substituted or unsubstituted alkyl groups having 1 to 12 carbon atoms (such as substituted or unsubstituted methyl, ethyl, isopropyl, t-butyl, benzyl, n-hexyl, decyl, and dodecyl groups), substituted or unsubstituted cycloalkyl groups having 5 to 10 carbon atoms in the ring (such as substituted or unsubstituted cyclopentyl and cyclohexyl groups), or substituted or unsubstituted aryl groups having 6 or 10 carbon atoms in the aromatic ring (such as phenyl, naphthyl, 3-methylphenyl, and 4-methoxyphenyl groups). More likely, $R_1$' and $R_2$' are independently substituted or unsubstituted alkyl groups having 1 to 4 carbon atoms.

This cyanine dye chromophore generally has one or more water-solubilizing groups such as carboxy (carboxylate), sulfo (sulfonate), and hydroxy groups. The carboxy and sulfo groups are most common. In some embodiments, at least three water-solubilizing groups are present. The water-solubilizing groups can be present on the heterocyclic rings or as part of a substituent anywhere in the molecule. For example, one or more of the $Z_1$, $Z_2$, $R_1$', and $R_2$' groups can comprise one or more carboxy or sulfo groups.

Thus, in many embodiments, W is —N($Q_1$)($Q_2$) wherein $Q_1$ and $Q_2$ are the same or different substituted or unsubstituted phenyl groups, A and A' are independently —S—, —O—, or —CR'R" groups wherein R' and R" are independently substituted or unsubstituted alkyl groups, $Z_1$ and $Z_2$ are each substituted or unsubstituted naphtho condensed rings, Z represents the atoms needed to complete a 5-membered carbocyclic ring, and $R_1$' and $R_2$' are independently substituted or unsubstituted alkyl groups having 1 to 4 carbon atoms, provided one or more of $Z_1$, $Z_2$, $R_1$', and $R_2$' comprise one or more carboxy or sulfo groups.

The cyanine dye chromophore described herein can be associated with any suitable cation.

The cyanine dyes are generally present in the topcoat layer in an amount of from about 1 to about 12 weight %, typically from about 2 to about 8 weight %, based on total topcoat layer dry weight. These compounds can be readily prepared using known starting materials and procedures. Representative examples of cyanine dyes useful in the topcoat layer are the IR Dyes A through D used in the Examples below.

Compounds that generate an acid during exposure to infrared radiation ("acid generators") can be ionic or non-ionic. Any compound that is soluble in the topcoat layer formulation and can generate an acid in those conditions is useful. Generally, they are materials that form Bronsted acid by thermally initiated decomposition.

Non-ionic acid generators include, for example, haloalkyl-substituted s-triazines that are s-triazines substituted with one to three $CX_3$ groups in which X is bromo or chloro. Examples of such compounds include but are not limited to, 2-phenyl-4,6-bis(trichloromethyl)-s-triazine, 2,4,6-tris(trichloromethyl)-s-triazine, 2-methyl-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, and 2-[4-(2-ethoxyethyl)-naphtho-1-yl]-4,6-bis-trichloromethyl-s-triazine. Examples of useful water-soluble haloalkyl-substituted s-triazines are described in U.S. Pat. No. 6,010,821 (Smith et al.) having a general structures shown in Columns 6 and 7. Another useful example is the Water-Soluble Triazine Initiator A described in EP 1,075,942 (Kawamura et al.) having the structure shown in paragraph [0098].

Ionic acid generators include, for example, onium salts in which the onium cation is iodonium, sulfonium, phosphonium, oxysulphoxonium, oxysulphonium, sulphoxonium, ammonium, diazonium, selenonium, or arsonium, and the anion is a chloride, bromide, or a non-nucleophilic anion such as tetra-fluoroborate, hexafluorophosphate, hexafluoroarsenate, hexafluoroantimonate, triflate, tetrakis(pentafluoro-phenyl)borate, pentafluoroethyl sulfonate, p-methyl-benzyl sulfonate, ethyl sulfonate, trifluoromethyl acetate, and pentafluoroethyl acetate. Typical onium salts include, for example, diphenyl iodonium chloride, diphenyl iodonium hexafluorophosphate, 4,4'-dicumyl iodonium chloride, 4,4'-dicumyl iodonium hexafluorophosphate, N-methoxy-a-picolinium-p-toluene sulfonate, 4-methoxybenzene-diazonium tetrafluoroborate, 4,4'-bis-dodecylphenyl iodonium-hexafluorophosphate, 2-cyanoethyl-triphenylphosphonium chloride, triphenyl sulfonium hexafluoroantimonate, triphenyl sulfonium tetrafluoroborate, 2-methoxy-4-aminophenyl diazonium hexafluorophosphate, phenoxyphenyl diazonium hexafluoroantimonate, and anilinophenyl diazonium hexafluoroantimonate.

The acid generating compound is generally present in the topcoat layer formulation in an amount of from about 2 to about 25 weight % and typically from about 5 to about 22 weight %, based on total solids in that formulation.

Additional additives to the topcoat layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.). Specific examples of phenolic compounds include but are not limited to, 2,4-dihydroxybenzophenone, 4,4'-isopropylidene-diephenol (Bisphenol A), p-t-butylphenol, 2,4,-dinitrophenol, 3,4-dichlorophenol, 4,4'-methylene-bis(2,6'-di-t-butylphenol), p-phenylphenol, 1,1-bis(4-hydroxyphenyl)cyclohexane, 1,1-bis(4-hydroxyphenyl)-2-ethylhexene, 2,2-bis(4-hydroxyphenyl)butane, 2,2'-methylenebis(4-t-butylphenol), 2,2'-methylenebis(a-phenyl-p-cresol) thiodiphenol, 4,4'-thiobis(6-t-butyl-m-cresol) sulfonyldiphenol, p-butylphenol-formalin condensate, and p-phenylphenol-formalin condensate. Examples of useful organic acids or salts thereof include but are not limited to, phthalic acid, phthalic anhydride, maleic acid, benzoic acid, gallic acid, o-toluic acid, p-toluic acid, salicylic, 3-t-butyl-salicylic, 3,5-di-3-t-butylsalicylic acid, 5-a-methylbenzyl-salicylic acid, 3,5-bis(a-methylbenzyl)salicylic acid, 3-t-octylsalicylic acid, and their zinc, lead, aluminum, magnesium, and nickel salts. Examples of the oxybenzoic acid esters include but are not limited to, ethyl p-oxybenzoate, butyl p-oxybenzoate, heptyl p-oxybenzoate, and benzyl p-oxybenzoate. Such color developers may be present in an amount of from about 0.5 to about 5 weight %, based on total topcoat layer dry weight.

Imageable Elements

The imageable elements can be formed by suitable application of a radiation-sensitive composition as described above to a suitable substrate to form an imageable layer, followed by suitable application of a topcoat layer formulation. This substrate can be treated or coated in various ways as described below prior to application of the radiation-sensitive composition to improve hydrophilicity. Typically, there is only a single imageable layer comprising the radiation-sensitive composition.

The substrate generally has a hydrophilic surface, or at least a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and phosphoric acid anodized aluminum support that provides a hydrophilic surface for lithographic printing.

Sulfuric acid anodization of the aluminum support generally provides an oxide weight (coverage) on the surface of from about 1.5 to about 5 g/m² and more typically from about 3 to about 4.3 g/m². Phosphoric acid anodization generally provides an oxide weight on the surface of from about 1.5 to about 5 g/m² and more typically from about 1 to about 3 g/m².

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], poly(acrylic acid), or an acrylic acid copolymer to increase hydrophilicity. Still further, the aluminum support may be treated with a phosphate solution that may further contain an inorganic fluoride (PF). The aluminum support can be electrochemically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an imageable layer and a topcoat layer formulation is applied to that layer.

Illustrative of such manufacturing methods is mixing the radically polymerizable component, primary polymeric binder, initiator composition, infrared radiation absorbing compound, and any other components of the radiation-sensitive composition in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.1 and up to and including 5 g/m² or at least 0.5 and up to and including 3.5 g/m².

Layers can also be present under the imageable layer to enhance developability or to act as a thermal insulating layer. The underlying layer should be soluble or at least dispersible in the developer and typically have a relatively low thermal conductivity coefficient.

The topcoat layer formulations can be prepared and applied in a similar fashion by dissolving or dispersing the desired components described above in suitable solvents or mixtures of solvents including but not limited to, water or water with one or more of iso-propanol, methanol, or other alcohols or ketones in an amount of up to 15 weight %. A surfactant may be included to improve coatability.

The various layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the imageable element can be enclosed in water-impermeable material that substantially inhibits the transfer of moisture to and from the imageable element as described in U.S. Pat. No. 7,175,969 (noted above) that is incorporated herein by reference.

Imaging Conditions

During use, the imageable element is exposed to a suitable source of imaging or exposing near-infrared or infrared radiation, depending upon the radiation absorbing compound present in the radiation-sensitive composition, at a wavelength of from about 700 to about 1500 nm. For example, imaging can be carried out using imaging or exposing radiation, such as from an infrared laser at a wavelength of at least 700 nm and up to and including about 1400 nm and typically at least 750 nm and up to and including 1250 nm. Imaging can be carried out using imaging radiation at multiple wavelengths at the same time if desired.

The laser used to expose the imageable element is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 nm and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm² and up to and including 500 mJ/cm², and typically at least 50 and up to and including 300 mJ/cm² depending upon the sensitivity of the imageable layer.

While laser imaging is desired in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

With or without a post-exposure baking step after imaging and before development, the imaged elements can be developed "on-press" as described in more detail below. In most embodiments, a post-exposure baking step is omitted. On-press development avoids the use of alkaline developing solutions typically used in conventional processing apparatus. The imaged element is mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the hydrophilic substrate revealed by the imaging and development steps, and ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

Unless otherwise noted below, the chemical components used in the Examples can be obtained from one or more commercial courses such as Aldrich Chemical Company (Milwaukee, Wis.).

The components and materials used in the examples and analytical methods used in evaluation were as follows:

BLO represents γ-butyrolactone.

FluorN™2900 is a fluorosurfactant that was obtained from Cytonix Corporation (Beltsville, Md.).

IB05 represents bis(4-t-butylphenyl) iodonium tetraphenylborate.

IPA represents iso-propyl alcohol.

IR Dyes A to D have the following structures:

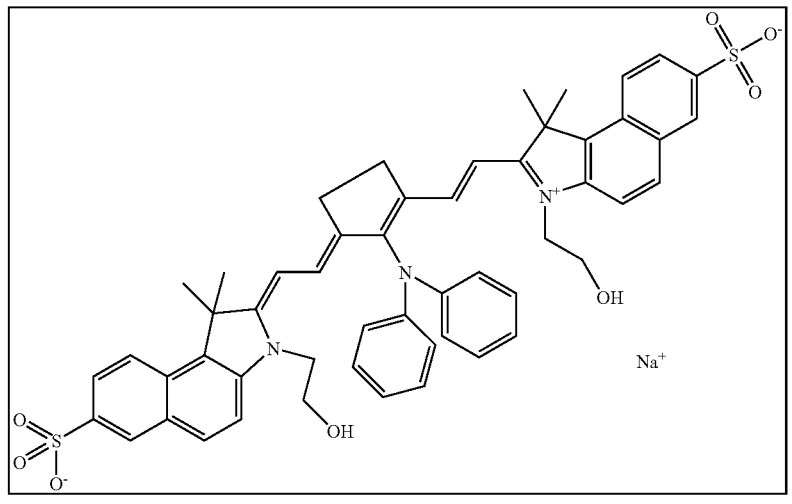

IR Dye A

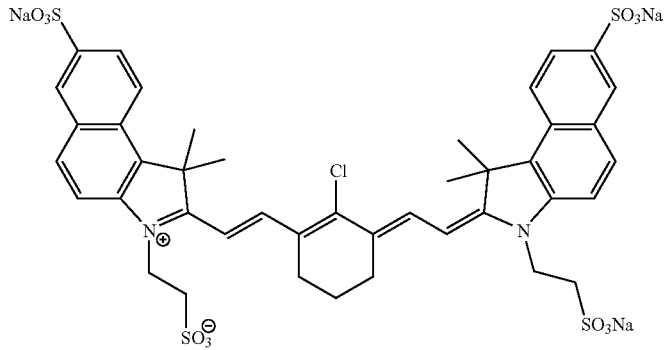

IR Dye B

-continued

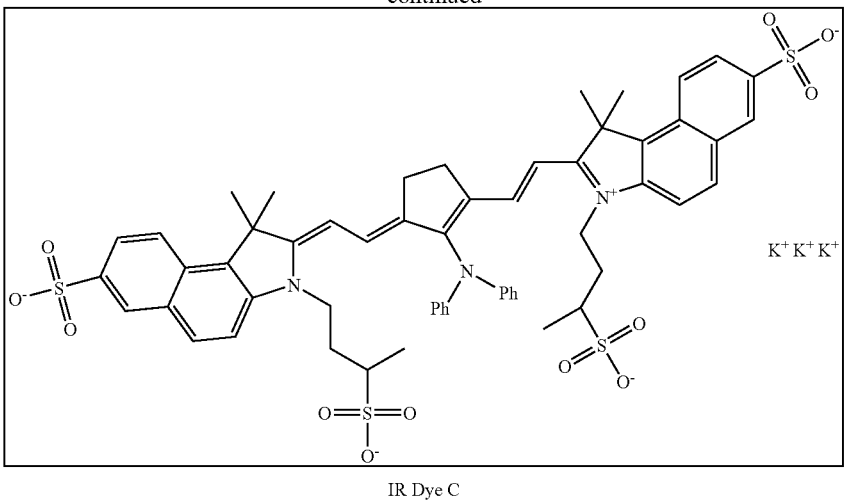

IR Dye C

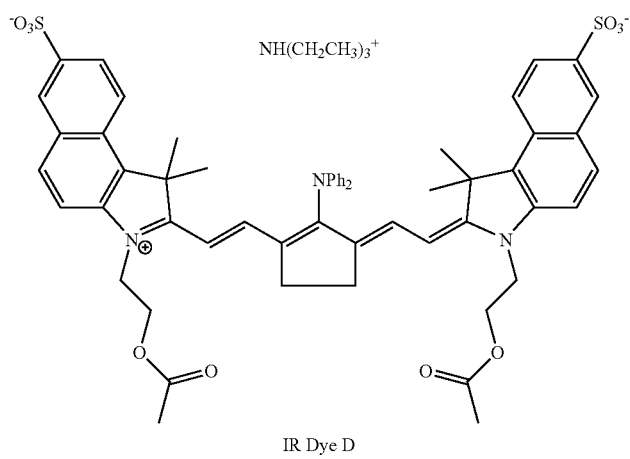

IR Dye D

Masurf® FS-1520 is a fluoroaliphatic betaine fluorosurfactant that was obtained from Mason Chemical Company (Arlington Heights, Ill.).

MEK represents methyl ethyl ketone.

NK Ester A-DPH is a dipentaerythritol hexaacrylate that was obtained from Kowa American (New York, N.Y.).

PGME represents 1-methoxy-2-propanol.

Phosmer PE is an ethylene glycol methacrylate phosphate with 4-5 ethoxy groups that was obtained from Uni-Chemical Co. Ltd. (Japan).

Polymer A is a 10/70/20 weight percent copolymer emulsion/dispersion of polyethylene glycol methyl ether methacrylate acrylonitrile/styrene (25%).

PVA405 is a poly(vinyl alcohol) with a hydrolysis degree of 81% that was obtained from Kuraray (Japan)

PVA488 is a poly(vinyl alcohol) with a hydrolysis degree of 88% that was obtained from Kuraray (Japan)

R-gen 1130 is bistolyliodonium hexafluorophosphate that was obtained from Chitec Technology Co., Ltd (Taiwan).

S0930 is an IR Dye that was obtained from FEW Chemicals GmbH (Germany) and is represented by the following formula:

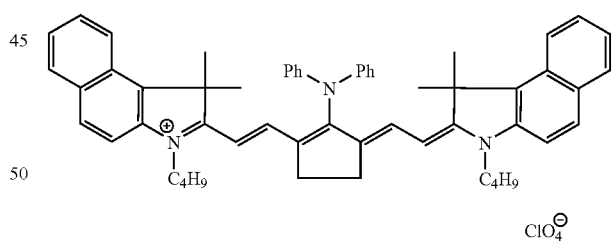

Sartomer SR399 is dipentaerythritol pentaacrylate that was obtained from Sartomer Company, Inc.

Varn Litho Etch 142W fountain solution was obtained from Varn International (Addison, Ill.).

Varn PAR alcohol replacement was obtained from Varn International.

The "DH Test" used in the examples was a dry-heat accelerated aging test carried out at 48° C. for 5 days.

The "RH Test" was a high humidity accelerated aging test carried out at 38° C. and a relative humidity of 85% for 5 days.

"Printout" is equal to the optical density of the imaged area of an imageable element subtracted by the optical density of the non-imaged area of an imageable element. Optical density was measured with a Gretag densitometer (D196, Regensdorf, Switzerland) using cyan filter. A Printout of 0.04 or less is considered poor, 0.05 and 0.06 is rated good, and 0.07 or more is considered strong.

Invention Example 1

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that had been post-treated with poly(vinyl phosphonic acid) to provide a dry coating weight of about 0.9 g/m$^2$.

On the resulting imageable layer, a topcoat formulation comprising 0.20 g of IR Dye C, 0.6 g of diphenyliodonium chloride (DPIC), 4 g of PVA488, 4 g of IPA, 92 g of water, and 0.02 g of Masurf® FS-1520 was applied to provide a dry coating weight of about 0.4 g/m$^2$. Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm$^2$ (10 Watts, 250 rpm), the resulting solid image showed a strong printout of 0.07.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS 151. An imaged fresh element was developed in 15 impressions under the application of the both fountain solution and ink and another 200 good impressions were printed and showed strong images of both solid and highlights using exposure energies as low as 50 mJ/cm$^2$. After the 5-day "DH" and "RH" tests as described above, this imageable element was developed in 25 sheets and 50 sheets, respectively.

Invention Example 2

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that had been post-treated with poly(vinyl phosphonic acid) to provide a dry coating weight of about 0.9 g/m$^2$.

On the resulting imageable layer, a topcoat formulation comprising 0.40 g of IR Dye C, 0.6 g of diphenyliodonium chloride (DPIC), 4 g of PVA488, 4 g of IPA, 92 g of water, and 0.02 g of Masurf® FS-1520 was applied to provide a dry coating weight of about 0.4 g/m$^2$. Both formulations were applied using a wire-wound rod and then dried for approximately 60 seconds in a Ranar conveyor oven set at 120° C.

The resulting imageable element was placed on a Kodak Trendsetter® 3244x image setter and exposed using an 830 nm IR laser. At the exposure of 100 mJ/cm$^2$ (10 Watts, 250 rpm), the resulting solid image showed a strong printout of 0.08.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS 151. An imaged fresh element was developed in 15 impressions under the application of the both fountain solution and ink and another 200 good impressions were printed and showed strong images of both solid and highlights using exposure energies as low as 50 mJ/cm$^2$. After the 5-day "DH" and "RH" tests as described above, this imageable element was developed in 50 sheets and 50 sheets, respectively.

Invention Example 3

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that had been post-treated with poly(vinyl phosphonic acid) to provide a dry coating weight of about 0.9 g/m$^2$.

On the resulting imageable layer, a topcoat formulation comprising 0.20 g of IR Dye C, 1.2 g of diphenyliodonium chloride (DPIC), 4 g of PVA488, 4 g of IPA, 92 g of water, and 0.02 g of Masurf® FS-1520 was applied to provide a dry coating weight of about 0.4 g/m$^2$. Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm$^2$ (10 Watts, 250 rpm), the resulting solid image showed a strong printout of 0.08.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. An imaged fresh element was developed in 15 impressions under the application of the both fountain solution and ink and another 200 good impressions were printed and showed strong images of both solid and highlights using exposure energies as low as 50 mJ/cm$^2$. After the 5-day "DH" and "RH" tests as described above, this imageable element was developed in 50 sheets and 100 sheets, respectively.

Invention Example 4

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that had been post-treated with poly(vinyl phosphonic acid) to provide a dry coating weight of about 0.9 g/m$^2$.

On the resulting imageable layer, a topcoat formulation comprising 0.20 g of IR Dye A, 0.6 g of diphenyliodonium chloride (DPIC), 4 g of PVA488, 4 g of IPA, 92 g of water, and 0.02 g of Masurf® FS-1520 was applied to provide a dry coating weight of about 0.4 g/m$^2$. Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm² (10 Watts, 250 rpm), the resulting solid image showed a good printout of 0.05.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. An imaged fresh element was developed in 15 impressions under the application of the both fountain solution and ink and another 200 good impressions were printed and showed strong images of both solid and highlights using exposure energies as low as 50 mJ/cm². After the 5-day "DH" and "RH" tests as described above, this imageable element was developed in 25 sheets and 50 sheets, respectively.

Invention Example 5

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that had been post-treated with poly(vinyl phosphonic acid) to provide a dry coating weight of about 0.9 g/m².

On the resulting imageable layer, a topcoat formulation comprising 0.20 g of IR Dye B, 0.6 g of R-gen 1130, 4 g of PVA488, 4 g of IPA, 3.5 of MEK, 3.5 g of methanol, 85 g of water, and 0.02 g of Masurf® FS-1520 was applied to provide a dry coating weight of about 0.4 g/m². Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm² (10 Watts, 250 rpm), the resulting solid image showed a strong printout of 0.09.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. An imaged fresh element was developed in 50 impressions under the application of the both fountain solution and ink and another 200 good impressions were printed and showed strong images of both solid and highlights using exposure energies as low as 50 mJ/cm².

Invention Example 6

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that had been post-treated with poly(vinyl phosphonic acid) to provide a dry coating weight of about 0.9 g/m².

On the resulting imageable layer, a topcoat formulation comprising 0.4g of IR dye B, 1.2 g of R-gen 1130, 4 g of PVA488, 4 g of IPA, 3.5 of MEK, 3.5 g of methanol, 85 g of water, and 0.02 g of Masurf® FS-1520 was applied to provide a dry coating weight of about 0.4 g/m². Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm² (10 Watts, 250 rpm), the resulting solid image showed a strong printout of 0.08.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. An imaged fresh element was developed in 100 impressions under the application of the both fountain solution and ink and another 200 good impressions were printed and showed strong images of both solid and highlights using exposure energies as low as 50 mJ/cm².

Invention Example 7

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that had been post-treated with poly(vinyl phosphonic acid) to provide a dry coating weight of about 0.9 g/m².

On the resulting imageable layer, a topcoat formulation comprising 0.2 g of IR dye B, 0.4 g of R-gen 1130, 4 g of PVA488, 4 g of IPA, 3.5 of MEK, 3.5 g of methanol, 85 g of water, and 0.02 g of Masurf® FS-1520 was applied to provide a dry coating weight of about 0.4 g/m². Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm² (10 Watts, 250 rpm), the resulting solid image showed a strong printout of 0.07.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. An imaged fresh element was developed in 100 impressions under the application of the both fountain solution and ink and another 200 good impressions were printed and showed strong images of both solid and highlights using exposure energies as low as 50 mJ/cm².

Comparative Example 1

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that had been post-treated with poly(vinyl phosphonic acid) to provide a dry coating weight of about 0.9 g/m². On the resulting imageable layer, a topcoat formulation comprising 4 g of PVA488, 4 g of IPA, 92 g of water, and 0.02 g of Masurf® FS-1520 was applied to provide a dry coating weight of about 0.4 g/m².

Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm$^2$ (10 Watts, 250 rpm), the resulting solid image showed a printout of 0.04.

Invention Example 8

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that has a post-treatment of inorganic monosodium phosphate solution activated by sodium fluoride to provide a dry coating weight of about 0.9 g/m$^2$.

On the resulting imageable layer, a topcoat formulation comprising 0.20 g of IR dye C, 0.6 g of triphenylsulfonium chloride (TPSC), 4 g of PVA488, 4 g of IPA, 92 g of water, and 0.02 g of Masurf® FS-1520 was applied to provide a dry coating weight of about 0.4 g/m$^2$. Both formulations were applied using a wire-wound rod and then dried for approximately 60 seconds in a Ranar conveyor oven set at 120° C.

The resulting imageable element was placed on a Kodak Trendsetter® 3244x image setter and exposed using an 830 nm IR laser. At the exposure of 100 mJ/cm$^2$ (10 Watts, 250 rpm), the resulting solid image showed a good printout of 0.05.

Invention Example 9

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that has a post-treatment of inorganic monosodium phosphate solution activated by sodium fluoride to provide a dry coating weight of about 0.9 g/m$^2$.

On the resulting imageable layer, a topcoat formulation comprising 0.20 g of IR dye C, 0.6 g of tetrabutylphosphonium bromide (TBPB), 4 g of PVA488, 4 g of IPA, 92 g of water, and 0.02 g of Masurf® FS-1520 was applied to provide a dry coating weight of about 0.4 g/m$^2$. Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm$^2$ (10 Watts, 250 rpm), the resulting solid image showed a strong printout of 0.07.

Invention Example 10

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that has a post-treatment of inorganic monosodium phosphate solution activated by sodium fluoride to provide a dry coating weight of about 0.9 g/m$^2$.

On the resulting imageable layer, a topcoat formulation comprising 0.20 g of IR dye D, 0.6 g of diphenyliodonium chloride (DPIC), 4 g of PVA488, 4 g of IPA, 92 g of water, and 0.02 g of Masurf® FS-1520 was applied to provide a dry coating weight of about 0.4 g/m$^2$. Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm$^2$ (10 Watts, 250 rpm), the resulting solid image showed a good printout of 0.05.

Comparative Example 2

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that has a post-treatment of inorganic monosodium phosphate solution activated by sodium fluoride to provide a dry coating weight of about 0.9 g/m$^2$.

On the resulting imageable layer, a topcoat formulation comprising 4 g of PVA488, 4 g of IPA, 92 g of water, and 0.02 g of Masurf® FS-1520 was applied to provide a dry coating weight of about 0.4 g/m$^2$. Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm$^2$ (10 Watts, 250 rpm), the resulting solid image showed a printout of 0.04.

Invention Example 11

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that has a post-treatment of inorganic monosodium phosphate solution activated by sodium fluoride to provide a dry coating weight of about 0.9 g/m$^2$.

On the resulting imageable layer, a topcoat formulation comprising 0.20 g of IR dye B, 0.6 g of R-gen 1130, 4 g of PVA405, 4 g of IPA, 3.5 of MEK, 3.5 g of methanol, 85 g of water, and 0.02 g of Masurf® FS-1520 was applied to provide a dry coating weight of about 0.4 g/m$^2$. Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm$^2$ (10 Watts, 250 rpm), the resulting solid image showed a strong printout of 0.08.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. An imaged fresh element was developed in 25 impressions under the application of the both fountain solution and ink and another 200 good impressions were printed and showed strong images of both solid and highlights using exposure energies as low as 50 mJ/cm².

Another imaged element was tested on a Komori sheet-fed press using a wear ink containing 1.5% calcium carbonate and fountain solution containing Varn Litho Etch 142W at 3 oz/gal (23.4 ml/liter) and PAR alcohol replacement at 3 oz/gal (23.4 ml/liter). It was developed on-press using a combination of both fountain solution and lithographic printing ink during a press startup procedure of 10 revolutions of water followed by 10 revolutions of ink. At the end of the workday, the printing plate was cleaned with Aqua image cleaner/preserver and left mounted on the press for one night. Upon startup the following morning, the printing plate performed identically to the previous evening. At 100 mJ/cm2 exposure energy, the printing plate was used to generate 27,500 good impressions without any solid wear.

Invention Example 12

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that has a post-treatment of inorganic monosodium phosphate solution activated by sodium fluoride to provide a dry coating weight of about 0.9 g/m².

On the resulting imageable layer, a topcoat formulation comprising 0.10 g of IR dye B, 0.3 g of R-gen 1130, 4 g of PVA405, 4 g of IPA, 3.5 of MEK, 3.5 g of methanol, 85 g of water, and 0.02 g of Masurf® FS-1520 was applied to provide a dry coating weight of about 0.4 g/m². Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm² (10 Watts, 250 rpm), the resulting solid image showed a strong printout of 0.07.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS 151. An imaged fresh element was developed in 20 impressions under the application of the both fountain solution and ink and another 200 good impressions were printed and showed strong images of both solid and highlights using exposure energies as low as 50 mJ/cm².

Another imaged element was tested on a Komori sheet-fed press using a wear ink containing 1.5% calcium carbonate and fountain solution containing Varn Litho Etch 142W at 3 oz/gal (23.4 ml/liter) and PAR alcohol replacement at 3 oz/gal (23.4 ml/liter). It was developed on-press using a combination of both fountain solution and lithographic printing ink during a press startup procedure of 10 revolutions of water followed by 10 revolutions of ink. At the end of the workday, the printing plate was cleaned with Aqua image cleaner/preserver and left mounted on the press for one night. Upon startup the following morning, the printing plate performed identically to the previous evening. At 100 mJ/cm2 exposure energy, the printing plate was used to generate 30,000 good impressions without any solid wear.

Invention Example 13

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that has a post-treatment of inorganic monosodium phosphate solution activated by sodium fluoride to provide a dry coating weight of about 0.9 g/m².

On the resulting imageable layer, a topcoat formulation comprising 0.20 g of IR dye C, 0.6 g of diphenyliodonium chloride (DPIC), 4 g of PVA405, 4 g of IPA, 92 g of water, and 0.02 g of Masurf® FS-1520 was applied to provide a dry coating weight of about 0.4 g/m². Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm² (10 Watts, 250 rpm), the resulting solid image showed a strong printout of 0.10.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. An imaged fresh element was developed in 20 impressions under the application of the both fountain solution and ink and another 200 good impressions were printed and showed strong images of both solid and highlights using exposure energies as low as 50 mJ/cm².

Another imaged element was tested on a Komori sheet-fed press using a wear ink containing 1.5% calcium carbonate and fountain solution containing Varn Litho Etch 142W at 3 oz/gal (23.4 ml/liter) and PAR alcohol replacement at 3 oz/gal (23.4 ml/liter). It was developed on-press using a combination of both fountain solution and lithographic printing ink during a press startup procedure of 10 revolutions of water followed by 10 revolutions of ink. At the end of the workday, the printing plate was cleaned with Aqua image cleaner/preserver and left mounted on the press for one night. Upon startup the following morning, the printing plate performed identically to the previous evening. At 100 mJ/cm2 exposure energy, the printing plate was used to generate 31,500 good impressions without any solid wear.

Invention Example 14

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that has a post-treatment of inorganic monosodium phosphate solution activated by sodium fluoride to provide a dry coating weight of about 0.9 g/m².

On the resulting imageable layer, a topcoat formulation comprising 0.10 g of IR dye C, 0.3 g of diphenyliodonium chloride (DPIC), 4 g of PVA405, 4 g of IPA, 92 g of water, and 0.02 g of Masurf® FS-1520 was applied to provide a dry coating weight of about 0.4 g/m². Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm² (10 Watts, 250 rpm), the resulting solid image showed a strong printout of 0.09.

The imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. An imaged fresh element was developed in 15 impressions under the application of the both fountain solution and ink and another 200 good impressions were printed and showed strong images of both solid and highlights using exposure energies as low as 50 mJ/cm².

Another imaged element was tested on a Komori sheet-fed press using a wear ink containing 1.5% calcium carbonate and fountain solution containing Varn Litho Etch 142W at 3 oz/gal (23.4 ml/liter) and PAR alcohol replacement at 3 oz/gal (23.4 ml/liter). It was developed on-press using a combination of both fountain solution and lithographic printing ink during a press startup procedure of 10 revolutions of water followed by 10 revolutions of ink. At the end of the workday, the printing plate was cleaned with Aqua image cleaner/preserver and left mounted on the press for one night. Upon startup the following morning, the printing plate performed identically to the previous evening. At 100 mJ/cm2 exposure energy, the printing plate was used to generate 35,000 good impressions without any solid wear.

Comparative Example 3

An imageable layer formulation was prepared by dissolving or dispersing 3.1 g of Polymer A, 0.5 g of SR399, 0.5 g of NK ester A-DPH, 0.1 g of Phosmer PE, 0.15 g of IB-05, 0.05 g of S0930, 0.4 g of FluorN™ 2900 (5% in PGME) in 2 g of BLO, 7.0 g of PGME, 6 g of MEK, and 3 g of methanol. This formulation was applied to an electrochemically grained and sulfuric acid anodized aluminum substrate that has a post-treatment of inorganic monosodium phosphate solution activated by sodium fluoride to provide a dry coating weight of about 0.9 g/m².

On the resulting imageable layer, a topcoat formulation comprising 4 g of PVA405, 4 g of IPA, 92 g of water, and 0.02 g of Masurf® FS-1520 was applied to provide a dry coating weight of about 0.4 g/m². Both formulations were applied using a wire-wound rod and then dried for approximately 60 seconds in a Ranar conveyor oven set at 120° C.

The resulting imageable element was placed on a Kodak Trendsetter® 3244x imagesetter and exposed using an 830 nm IR laser. At the exposure of 100 mJ/cm² (10 Watts, 250 rpm), the resulting solid image showed a printout of 0.04.

Another imaged element was tested on a Komori sheet-fed press using a wear ink containing 1.5% calcium carbonate and fountain solution containing Varn Litho Etch 142W at 3 oz/gal (23.4 ml/liter) and PAR alcohol replacement at 3 oz/gal (23.4 ml/liter). It was developed on-press using a combination of both fountain solution and lithographic printing ink during a press startup procedure of 10 revolutions of water followed by 10 revolutions of ink. At the end of the workday, the printing plate was cleaned with Aqua image cleaner/preserver and left mounted on the press for one night. Upon startup the following morning, the printing plate performed identically to the previous evening. At 100 mJ/cm2 exposure energy, the printing plate was used to generate 30,000 good impressions without any solid wear.

The invention has been described in detail with particular reference to certain preferred embodiments thereof, but it will be understood that variations and modifications can be effected within the spirit and scope of the invention.

The invention claimed is:

1. A negative-working, on-press developable imageable element comprising a substrate having thereon an imageable layer comprising:
    a radically polymerizable component,
    an initiator composition capable of generating free radicals sufficient to initiate polymerization of free radically polymerizable groups upon exposure to imaging infrared radiation,
    a primary polymeric binder that has a backbone and is optionally present in the form of discrete particles, and
    an infrared radiation absorbing dye,
    said element further comprising a topcoat layer disposed on said imageable layer, said topcoat layer comprising a water-soluble polymer binder and a composition that is capable of changing color upon exposure to imaging infrared radiation,
    wherein said composition that is capable of changing color upon exposure to imaging infrared radiation comprises: (1) an acid-generating compound in an amount of from about 2 to about 25 weight %, and (2) an infrared radiation absorbing compound in an amount of from about 1 to about 12 weight %, both based on total dry weight of said topcoat layer, and
    wherein said initiator composition comprises a diaryliodonium cation and a boron-containing anion at a molar ratio of at least 1.2:1 and up to 3.0:1.

2. The element of claim 1 wherein said composition that is capable of changing color upon exposure to imaging infrared radiation comprises: (1) an infrared radiation absorbing compound, (2) a compound that in the presence of said infrared radiation absorbing compound, generates an acid in response to imaging infrared radiation, and (3) optionally, one or more compounds that provide a color change in the presence of an acid.

3. The element of claim 2 wherein component (3) is present and is a colorant that provides a color change in the presence of an acid.

4. The element of claim 2 wherein said infrared radiation absorbing compound in said topcoat layer, comprises a cyanine dye chromophore that is represented by the following Structure (CHROMOPHORE):

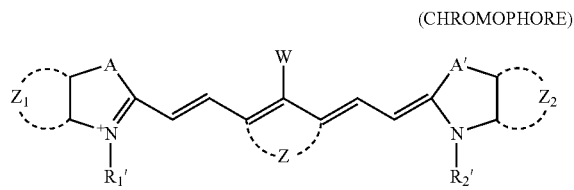

(CHROMOPHORE)

wherein W is —N(Q₁)(Q₂) or Cl, wherein $Q_1$ and $Q_2$ are independently substituted or unsubstituted aryl groups,
    A and A' are independently —S—, —O—, —NH—, —CH₂—, or —CR'R"— groups wherein R' and R" are independently substituted or unsubstituted alkyl groups, or
    R' and R" together can form a substituted or unsubstituted cyclic group, Z represents the carbon atoms needed to form a 5-to 7-membered carbocyclic ring, $Z_1$ and $Z_2$ are independently substituted or unsubstituted benzo or naphtho condensed rings, and $R_1'$ and $R_2'$ are independently substituted or unsubstituted alkyl, cycloalkyl, or aryl groups, provided that said cyanine dye chromophore further comprises one or more water-solubilizing groups.

5. The element of claim 4 wherein W is —N($Q_1$)($Q_2$) wherein $Q_1$ and $Q_2$ are the same or different substituted or unsubstituted phenyl groups, A and A' are independently —S—, —O—, or —CR'R" groups wherein R' and R" are independently substituted or unsubstituted alkyl groups, $Z_1$ and $Z_2$ are each substituted or unsubstituted naphtho condensed rings, and $R_1'$ and $R_2'$ are independently substituted or unsubstituted alkyl groups having 1 to 4 carbon atoms, provided one or more of $Z_1$, $Z_2$, $R_1'$, and $R_2'$ comprise one or more carboxy or sulfo groups.

6. The element of claim 4 wherein said cyanine dye chromophore comprises at least three carboxy or sulfo groups.

7. The element of claim 1 wherein said composition that is capable of changing color upon exposure to imaging infrared radiation comprises an acid-generating compound that is a halo-substituted s-triazine or an onium salt.

8. The element of claim 1 wherein said primary polymeric binder is present as discrete particles and comprises poly(alkylene oxide) segments, pendant cyano groups, or both poly(alkylene oxide) segments and pendant cyano groups.

9. The element of claim 1 wherein said primary polymeric binder is in the form of discrete particles having an average particle size of from about 10 to about 500 nm, and is present in said imageable layer in an amount of at least 10% and up to 90% based on the total imageable layer dry weight.

10. The element of claim 1 wherein said initiator composition comprises an iodonium compound, or the combination of a diaryliodonium cation and a boron-containing anion, wherein said diaryliodonium cation is represented by the following Structure (IB):

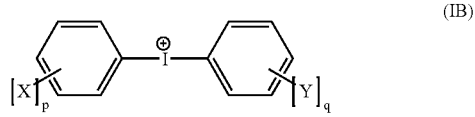

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5, provided that either p or q is at least 1, and said boron-containing anion is represented by the following Structure ($IB_Z$):

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom, such rings having up to 7 carbon, nitrogen, oxygen, or nitrogen atoms.

11. The element of claim 10 wherein at least 3 of $R_1$, $R_2$, $R_3$, and $R_4$ are the same or different substituted or unsubstituted aryl groups, wherein either p or q is at least 1 and the sum of the carbon atoms in the X and Y substituents or fused ring(s) is at least 6.

12. The element of claim 1 wherein said substrate is an aluminum-containing substrate having a hydrophilic surface upon which said imageable layer is disposed.

13. The element of claim 1 wherein said topcoat layer comprises a poly(vinyl alcohol) as said water-soluble polymer binder.

14. The element of claim 1 wherein said imageable layer further comprises a phosphate(meth)acrylate that has a molecular weight greater than 200.

15. A method comprising:
A) imagewise exposing the imageable element of claim 1 using infrared imaging radiation to produce exposed and non-exposed regions, and
B) with or without a post-exposure baking step, developing said imagewise exposed element to remove predominantly only said non-exposed regions in the presence of a fountain solution, lithographic printing ink, or a combination thereof.

16. The method of claim 15 wherein said imageable element comprises a topcoat layer comprising: a water-soluble polymer binder that is a poly(vinyl alcohol), a compound that generates an acid upon exposure to imaging infrared radiation, and an infrared radiation absorbing dye that provides a color change in the presence of said acid.

* * * * *